United States Patent [19]

Chen et al.

[11] Patent Number: 4,490,210
[45] Date of Patent: Dec. 25, 1984

[54] LASER INDUCED DRY CHEMICAL ETCHING OF METALS

[75] Inventors: Lee Chen, Poughkeepsie, N.Y.; Tung J. Chuang, Los Gatos, Calif.; Gangadhara S. Mathad, Poughkeepsie, N.Y.

[73] Assignee: International Business Machines Corporation, Armonk, N.Y.

[21] Appl. No.: 573,451

[22] Filed: Jan. 24, 1984

[51] Int. Cl.³ .............................. C23F 1/02; B44C 1/22; C03C 15/00; C03C 25/06
[52] U.S. Cl. ..................... 156/643; 156/345; 156/635; 156/646; 156/656; 156/664; 156/666; 219/121 LJ; 427/53.1
[58] Field of Search ...... 219/121 L, 121 LH, 121 LJ, 219/121 FS, 121 LM; 156/345, 635, 643, 646, 656, 664, 666; 427/53.1

[56] References Cited

U.S. PATENT DOCUMENTS

| | | | |
|---|---|---|---|
| 3,364,087 | 1/1968 | Solomon et al. | 156/635 |
| 4,221,047 | 9/1980 | Narken et al. | 29/840 |
| 4,245,273 | 1/1981 | Feinberg et al. | 361/382 |
| 4,260,649 | 4/1981 | Dension et al. | 427/53.1 |
| 4,331,504 | 5/1982 | Chuang et al. | 156/635 |
| 4,332,999 | 6/1982 | Wittke | 219/121 LJ |

OTHER PUBLICATIONS

"Laser-Enhanced Gas-Surface Chemistry: Basic Processes and Applications" by T. J. Chuang, J. Vac. Sci. Technol. 21(3), Sep./Oct., 1982, pp. 798–806.

"Laser-Induced Chemical Etching of Ferrites" by J. Addy et al., IBM Technical Disclosure Bulletin, vol. 25 No. 7A Dec., 1982, p. 3256.

"A Fabrication Technique for Multilayer Ceramic Modules" by H. D. Kaiser et al., Solid State Technology/May, 1972, pp. 35–40.

"Laser-Enhanced Chemical Etching of Solid Surfaces" by T. J. Chuang, IBM J. Res. Develop. vol. 26 No. 2, Mar., 1982, pp. 145–150.

"Surface Etching by Laser-Generated Free Radicals" by J. I. Steinfeld et al., J. of the Electrochemical Society, vol. 127, No. 1, Jan., 1980, pp. 514–515.

Primary Examiner—William A. Powell
Attorney, Agent, or Firm—T. Rao Coca

[57] ABSTRACT

Disclosed is a method of etching a metallized substrate by laser radiation. The substrate is exposed to a selected gas which spontaneously reacts with the metal forming a solid reaction product with the metal by a partial consumption of the metal. A beam of radiation of a wavelength suitable for absorption by the reaction product and/or by the metal thereunder is applied in a desired pattern to vaporize the reaction product and thereby selectively etch the metal.

23 Claims, 4 Drawing Figures

LASER INDUCED DRY CHEMICAL ETCHING OF METALS

CROSS REFERENCE TO RELATED APPLICATION

L. Chen et al patent application Ser. No. 573,452, filed simultaneously with this application, entitled "Laser Induced Chemical Etching of Metals with Excimer Lasers".

BACKGROUND OF THE INVENTION

1. Field of the Invention

This invention concerns a method of radiation induced dry etching of a metallized substrate. More particularly, the invention concerns the use of a specially selected gas that reacts with the metal forming a solid reaction product which is capable of being removed when irradiated with a beam of laser radiation.

2. Description of the Prior Art

The trend in electronics today is towards systems of ever increasing component density. Increased component density permits designers to achieve greater speed and complexity of system performance while maintaining system size at a minimum. Additionally, increased component density enables manufacturers to lower production costs owing to the economies that can be realized using integrated circuit processing.

The desire for increased component density has given rise to very large scale integrated circuit (VLSI). In such circuits, designers pack large numbers of electrical components onto individual integrated circuit chips. Subsequently, these chips are ganged on a substrate to form larger circuits and functional blocks of a system.

To facilitate the mounting of the high density circuit chips, designers have developed the so-called multilayer ceramic (MLC) substrate. The MLC substrate is well known and has been described in such articles as "A Fabrication Technique for Multilayer Ceramic Modules" by H. D. Kaiser et al, appearing in Solid-State Technology, May 1972, pp 35–40.

An example of a semiconductor module including a multilayer ceramic substrate is given in U.S. Pat. No. 4,245,273 issued to Feinberg et al and assigned to the assignee of this application.

MLC manufacturers have found that substrate performance, particularly, the maximum circuit speed the substrate will sustain, can be increased by reducing the length of the thick film metal wiring built into the substrate to interconnect the chips. Designers have proposed to reduce interconnection wiring by replacing at least some of the MLC thick film circuits with multilayer thin film circuits. Particularly, designers have proposed to use thin film circuits at the MLC chip mounting surface. The thin film circuits are formed at the MLC chip mount surface as multiple layers of thin film metal separated by layers of insulation. The multiple metal layers are interconnected by vertical metallization which extends through holes commonly referred to as vias that are arranged in a predetermined pattern.

Because it is possible to make a line of smaller dimension using thin film technology as compared with thick film technology, it is possible to fit more circuits in a substrate plane. Where higher circuit density per plane is achieved, fewer planes are required and accordingly the circuit wiring length interconnecting the multiple planes can be reduced. By shortening the plane interconnection metallization less circuit inductance and parasitic capacitance is present permitting a higher performance frequency. This technique for increasing frequency capability has come to be referred to as Thin Film Redistribution (TFR). An illustration of an MLC including a TFR structure is provided in U.S. Pat. No. 4,221,047 issued to Narken et al and assigned to the assignee of this application.

While the size of TFR multilevel metallization structure is smaller than that of thick film, it is not as small as thin film metallization structure used on the chips. Because the TFR current is a combination of the currents supplied by the multiple chips, it is substantially greater than the chip current. The TFR metallization must therefore be of larger physical size than that of the chip to maintain current densities and associated heating at acceptable levels. Additionally, the dielectric separating the TFR metal layers is also thicker and of different composition. As taught in the above mentioned U.S. patents, copper is the metal most widely used for forming the metallization patterns. It is therefore obvious that copper etching is an essential process in both Thin Film Redistribution (TFR) and Metallized Ceramic Polyimide (MCP) technology and more generally for various packaging applications, where there is a need to define wiring patterns in thick copper films.

Unfortunately, because TFR metallization structures are larger than those of an integrated circuit (I.C.) chip and because the materials are somewhat different, the thin film process techniques conventionally used for I.C. chip metallization fabrication such as the lift off etching technique, and dry etching (plasma or reactive ion etching) cannot be easily used in making TFR structures. The lift off technique is complex and different to define thick films. Dry etching needs complex equipment and process steps involving inorganic masks such as MgO and $SiO_2$. Furthermore, dry etching is not accurately repeatable and controllable particularly in large batch processing.

On the other hand, new techniques have been recently explored, based primarily on the radiation-enhanced chemical interactions at gas-solid interfaces by energetic particles such as ions, electrons, and photons. Laser radiation, because of its monochromatic and coherent characteristics, can be readily focused or collimated onto solid surfaces and is well-suited to promoting surface reactions.

Techniques of etching various materials at high etch rates by using laser induced dry chemical etching have been reported in the literature. For example, Chuang in his article, "A Laser-Enhanced Chemical Etching of Solid Surfaces", IBM Journal of Research and Development, Vol. 26, No. 2, March 1982 reports that silicon and tantalum can be successfully etched by vibrational excitation of $SF_6$ using a $CO_2$ laser. In addition, Chuang notes the etching of silicon by dissociation of $SF_6$ using a $CO_2$ laser and the etching of silicon dioxide by dissociation of chlorine gas using an argon laser.

Reference is also made to the article entitled "Surface Etching by Laser-Generated Free Radicals" by Steinfeld et al, published in the Journal of the Electrochemical Society, Vol. 127, No. 1, January 1980, for a description of the etching of $SiO_2$ by the disassociation of $CF_3Br$ using a $CO_2$ laser and the etching of silicon nitride by the disassociation of $CF_2Cl_2$ and $CDF_3$ using a $CO_2$ laser.

Reference is also made to U.S. Pat. No. 4,260,649 which discloses a method and apparatus for chemical treatment of a silicon wafer wherein said wafer is exposed to a controlled gaseous atmosphere containing a gaseous constituent to be dissociated by laser radiation to produce a gaseous reactant product for reaction with a surface of the wafer. In this method the wavelength of the laser beam radiation is selected exclusively for splitting the desired bonds to produce only the desired reactant product without producing undesired by-products which could deleteriously interfere with the desired chemical reaction. As a specific example, this patent teaches selective etching of a metal over silicon or silicon dioxide by using gaseous $BCl_3$ at a few Torr pressure and irradiating the gas with a $CO_2$ laser of wavelength 10.6 μm to dissociate the $BCL_3$ into $BCl_2$ and Cl. The Cl component (and perhaps $BCl_2$) reacts with the metal to selectively etch the metal. Thus, in this method the surface to be treated is not directly irradiated with the laser beam.

SUMMARY OF THE INVENTION

The principal object of the present invention is to provide a method of selective laser induced chemical etching of a metallized substrate with high etch rates and superior resolution.

According to the present invention, the metallized substrate is mounted in a reaction chamber in which a vacuum of predetermined pressure is established. A selected gas which, in its dissociated or undissociated state, spontaneously forms a solid reaction product with the metal is introduced into the chamber. The gas forms a thin layer of the reaction product only on the metallized portion of the substrate by a partial consumption of the metal leaving the remaining areas of the substrate unaffected.

The solid reaction product layer is then irradiated with a patterned beam of laser radiation of a wavelength suitable for absorption by the reaction product and/or by the underlying metal. Wherever the laser radiation strikes, due to heating and/or excitation and, eventual vaporization, the reaction product is driven off. The reaction product formed in the areas of the metal which are not illuminated by the laser will remain unaffected and can be subsequently washed off in a suitable solvent. In this manner the metal is selectively etched in a pattern conforming to the laser beam pattern.

According to one feature of the invention, the gas utilized is a halogen gas. In this case, a metal halide solid reaction product is formed on the metal. The preferred wavelengths of the laser radiation for removal of the metal halide is in the range 200–1060 nm. For example, when the gas is chlorine and the metal is copper, the solid reaction product is copper chloride. A laser source that can be used to drive off copper chloride is a pulsed Nd:YAG laser operating at its natural wavelength of 1060 nm or at a wavelength of 532 nm which is obtained by frequency doubling of the natural wavelength or at a wavelength of 355 nm which is obtained by either frequency tripling or parametric oscillation of the natural wavelength. The pulse width of the Nd:YAG laser radiation is in the range 10 nanoseconds to 650μ sec and intensity in the range 1–3 MW/sq. cm. Another laser source that is conducive for vaporization of the copper chloride reaction product is a continuous wave argon laser operating at a wavelength of 515 nm and intensity in the range 0.3 KW/sq. cm to 200 MW/sq cm.

According to another feature of the invention, the gas utilized for forming the reaction product is a halogen based gas. In this situation there are three alternative techniques of etching the metal. In the first alternative, a multiwavelength pulsed laser having a UV component and a non-UV component is utilized. The UV component is necessary to selectively photodissociate the gas proximate the metal into reactant radicals and thereby enhance formation of the solid reaction product. The non-UV component wavelength is necessary for driving off the reaction product. An example of a multiwavelength laser is Nd:YAG laser operating at wavelengths of 1060 nm and 335 nm. In the second alternative, a UV lamp in combination with a laser operating at non-UV wavelengths is utilized. The UV lamp is necessary to dissociate the gas as discussed above in connection with the first alternative technique. The non-UV laser is necessary for vaporizing the reaction product. An example of a laser in the second approach is Nd:YAG operating at 1060 nm. In the third alternative, a single component laser source which is capable of not only thermally dissociating the gas particles into a halogen component which will react with the metal forming a reaction product, but also vaporization of the reaction product is utilized. Examples of single component laser sources include the continuous wave argon laser operating at a wavelength of 515 nm and the pulsed Nd-YAG laser operating at either 532 nm or 355 nm.

BRIEF DESCRIPTION OF THE DRAWINGS

The above and other objectives and advantages of this invention will be better understood with reference to the following detailed description of the invention read in conjunction with the accompanying figures in which.

DETAILED DESCRIPTION OF THE PREFERRED EMBODIMENT

Basically, the present process involves formation of a thin layer of a solid reaction product on a metal surface by reacting the metal with a selected gas and selectively irradiating the reaction product with a beam of laser radiation having a wavelength which can be absorbed by the reaction product and/or by the metal thereunder. Wherever the laser radiation strikes, due to excitation and heating caused by absorption of the radiation, the thin layer of reaction product is driven off exposing a fresh layer of metal. A new layer of solid reaction product is formed on the freshly exposed metal as before by reacting the metal with the gas. This new layer of reaction product is, in turn, removed by irradiating with the laser radiation. In this manner, the metal is etched.

The solid reaction product is formed by a partial consumption of the metal. In the areas of the metal which are not irradiated with laser radiation the reaction product remains in tact until removal by rinsing at the termination of the etch process in a diluted chemical solution. Due to the selective nature of etching the metal, patterning thereof is possible using the laser radiation.

Figure 1:
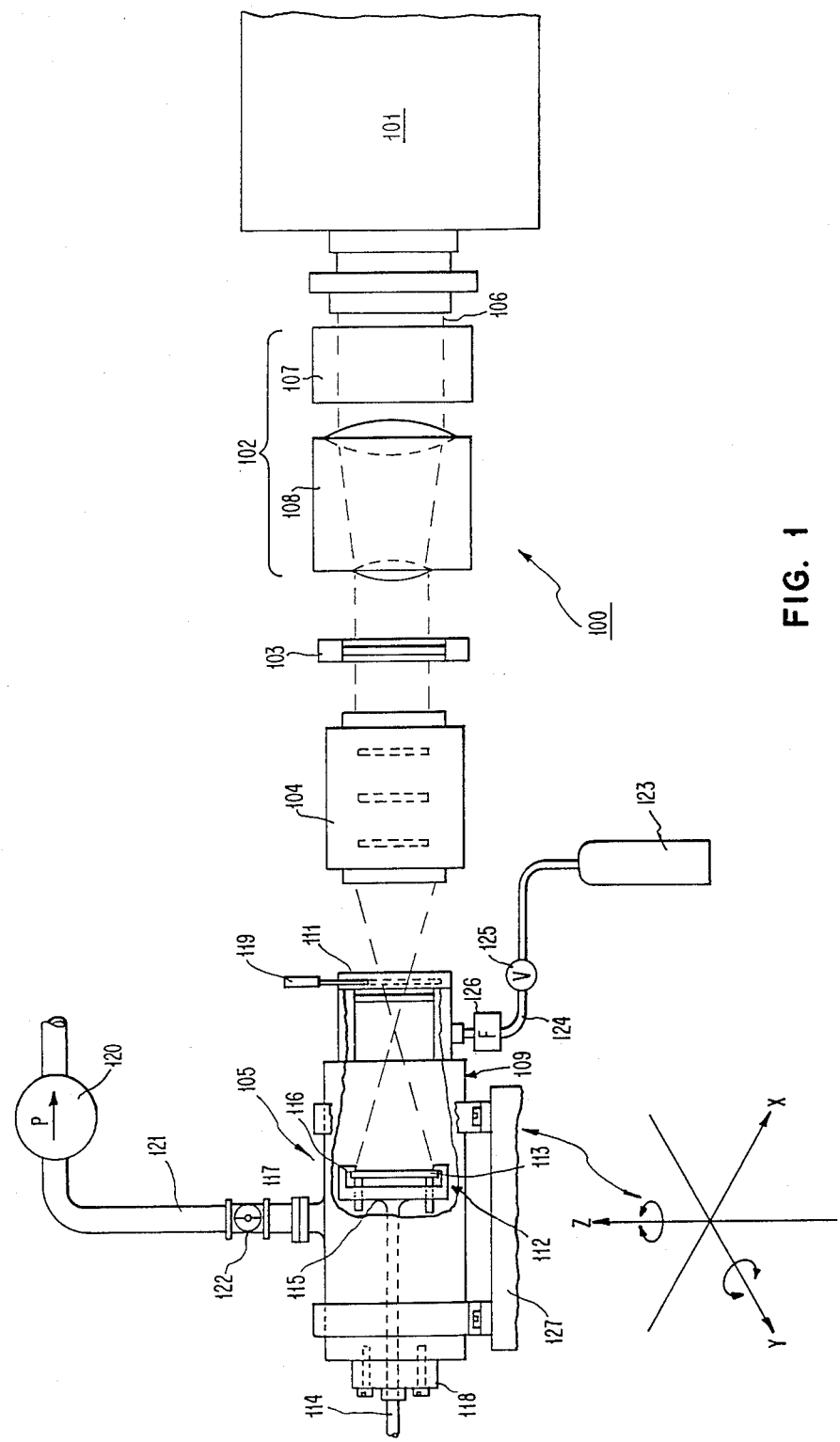
FIG. 1 is a diagrammatic representation of an apparatus for etching metals in accordance with the invention.

An etching system for carrying out the present invention is as shown in FIG. 1. As illustrated in FIG. 1, system 100 includes a laser 101, a laser beam modifier 102, a mask 103, a mask image projector 104 and a process station 105.

Laser 101 is used to heat and/or excite the reaction product which will be formed by the reaction of the metal surface with a selected gas mixture. The laser 101 generates a beam 106 which enters beam modifier 102. Beam modifier 102 includes a beam scrambler 107 and beam shaper 108. Beam scrambler 107 is used to render the intensity of the laser beam uniform across its diameter. Lasers typically produce beams having a Gaussian intensity distribution across their diameter. If this non-uniform intensity were to be projected to the substrate, the etch rate realized across the substrate would likewise be non-uniform. Accordingly, since uniformity of etch is desired, the beam is scrambled, i.e., rendered uniform. It should be noted that certain lasers are equipped with means for rendering their beams uniform. In such a case, the beam scrambler 107 may be eliminated.

Beam shaper 108 is used to transform the shape and size of the laser beam to that of mask 103. This is done in order to utilize the full power available from the laser, i.e., minimize light scattering and thereby improve system operating efficiency. Additionally, in some cases the beam cross section may be square where a beam of circular cross section is desired.

Both beam scrambler 107 and shaper 108 are conventional type and readily available commercially. As will be appreciated by those skilled in the art, scrambler 107 and shaper 108 are selected to be compatible with, i.e., transmit without substantial loss, the system laser beam.

Once the laser beam 106 is rendered uniform and shaped, it is passed through mask 103 to pattern beam 106's cross section. One of the advantages of a surface heated or excited laser etch system is that the patterning mask can be non-contact, i.e., spaced from the substrate to be etched.

Since the etching occurs only where the laser light strikes the substrate, it is not necessary to mask portions of the substrate not to be etched from the surrounding gas. Since no light strikes these portions, no etching will take place. This feature has great cost saving implications. It permits use of a single master mask and avoids the cost, time and difficulty associated with applying an individual contact mask to each of the substrates to be etched.

Mask 103 is of conventional type having a transparent body upon which an opaque pattern is formed. The opaque pattern corresponds to the areas of the substrate not to be etched. The opaque pattern may be formed in any conventional manner as, for example, by photolithographically patterning a layer deposited on the mask body. Like the elements of the beam modifier 102, mask 103 is selected to be compatible with the system laser light. That is to say, the transparent mask body is selected to transmit the system laser beam without significant intensity loss.

Once laser beam 106 is patterned by mask 103, the beam is projected to the substrate to be etched by projector 104. Projector 104 can be of any conventional type as, for example, a lens system as shown in FIG. 1, or a mirror system as is well known in the art. As in the case of the other optical components of the system, projector 104 is selected to be compatible with the system laser. As will be appreciated by those skilled in the art, while the system 100 shown in FIG. 1 uses a projector to transfer the mask image to the surface of the substrate the projector can be dispensed with if the mask were located in proximity to the substrate, i.e., within the reaction chamber system 105.

Referring to FIG. 1, the etch system 100 also includes a process station 105, which includes a housing 109 having a cylindrical reaction chamber 110 for receiving the substrate to be etched. Housing 109 is provided with a window 111 aligned with the axis of laser beam 106. Window 111 permits projection of beam 106 axially into chamber 110.

Within chamber 110 is provided a substrate mounting fixture 112 for receiving and positioning a metallized substrate 113, to be etched. Fixture 112 includes a mounting rod 114 attached to a substrate receiving platform 115. Platform 115 is provided with a reference face 116 and means, as for example, set screws 117, for biasing substrate 113 against reference face 116. This arrangement permits placement of substrate 113 perpendicular to the axis of laser beam 106 within reaction chamber 110.

Continuing with reference to FIG. 1, mounting rod 114 extends rearwardly from receiving plate 115 and is slidably and sealably received coaxially in removable rear housing wall 118. Rod 114 is made axially movable in chamber 110 so that substrate 113 can be placed at the focal point of projector 104. This permits a sharp focus of the image of mask 103 at substrate 113. As would be appreciated by those skilled in the art, a sharp focus of the light pattern leads to a more well defined etch.

Continuing with reference to FIG. 1, housing 109 is also provided with a shutter 119 at window 111. Shutter 119 permits interruption and controlled admission of the laser beam 106 into chamber 110 and substrate 113 therein.

Process station 105 additionally includes a vacuum pump 120 coupled to housing 109 by conduit 121 and valve system 122. Vacuum pump 120 provides the necessary low pressure within the reaction chamber 110. Pump 120 may be of a conventional type and in preferred form is capable of establishing and maintaining a vacuum of $10^{-7}$ torr. in the reaction chamber 110. This capability insures against presence of contaminants prior to initiation of the etch.

Process station 105 further includes a gas source 123 coupled to chamber 110 for supplying a gas which is capable of reacting with the surface of the substrate to be etched 113 and forming a solid reaction product. Gas source 123 may take any convenient form, e.g. cylinders, reservoirs, etc.

Gas source 123 is coupled to process chamber 110 by a valved conduit 124 through a source valve 125. A flow meter 126 is provided in conduit 124 to monitor the flow of gas into process chamber 110.

As shown in FIG. 1, housing 109 may be mounted on a movable table 127 to permit X, Y and Z movement of housing 109 and substrate 113 relative to laser beam 106. The movable table 127 is provided in order to permit alignment adjustments between the substrate and the laser beam.

The operation of the system is quite simple. The substrate 113 is mounted on the receiving platform 115 and loaded into the reaction chamber 110. The window shutter 119 is initially closed. The reaction chamber 110 is sealed off and pump 120 is activated to evacuate housing 109. Upon establishing the desired vacuum, the source valve 125 is opened permitting the gas from gas source 123 to enter chamber 110 for reacting with substrate 113 and forming a solid reaction product.

Thereafter, laser 101 is activated and stabilized. During this step, the housing window shutter 119 remains closed. Once the laser 101 and also the gas pressure in chamber 110 has been stabilized, the window shutter 119 is opened and substrate 113 is exposed to the patterned laser light causing substrate 113 to be etched in accordance with the laser pattern.

Following a predetermined etch time, the laser is deactivated and the process chamber flushed. Following flushing, the etched substrate is removed from chamber 110 and receiving platform 115.

It will be appreciated that the type of laser 101 used to practice the invention is dependent upon the nature of the reaction product formed on the metal since the wavelength of the laser radiation should be such that, upon irradiation, it can be efficiently absorbed by the reaction product. The nature of the reaction product, in turn, is a function of the metal selected for etching and the gas used for forming the reaction product by spontaneously reacting the gas with the metal.

In a typical example, when a halogen gas or halogen-based gas is utilized for reacting with a metal, forming a metal halide reaction product, the laser 101 is of a type that can generate a radiation having a wavelength in the range 200–1060 nm. Examples of lasers that can generate radiation having a wavelength in this range include a pulsed Nd:YAG laser which is capable of not only naturally generating the 1060 nm component, but also the 532 nm component by frequency doubling and the 355 nm component by frequency tripling or parametric oscillation of the natural component and the continuous argon laser which is capable of generating radiation of 515 nm wavelength.

In a specific example of the present invention, to etch copper, a ceramic substrate having a 5000 nm thick copper layer formed thereon is mounted on the receiving platform 115 and loaded into the reaction chamber 110. After establishing in chamber 110 a low pressure of $10^{-3}$ torr or less, chlorine gas from gas source 123 is introduced into the reaction chamber 110. The chlorine gas spontaneously reacts with the copper on the substrate forming a thin layer of copper chloride solid reaction product thereon. In this reaction a thin layer of copper is consumed. The reaction product formation is limited to the area of the substrate where copper is present.

To achieve selective etching of the copper, a pulsed beam of radiation from a Nd:YAG laser 101 operating at a wavelength of 1060 nm or 532 nm or 355 nm, at an intensity of 1–3 MW/sq. cm, and having a pulse width in the range 10 nanoseconds to 650 μsec is made to strike the reaction product in a pattern determined by the mask 103. The reaction product irradiated in this manner effectively absorbs the laser radiation and, due to the energy imparted, undergoes thermal and/or electronic excitation and eventually vaporizes. In this manner a thin layer of copper, corresponding to the thickness of the copper consumed by the gas to form a reaction product, is removed. The etched regions of copper will again react with the gas, which continuously flows through the reaction chamber 110 during the etch process, forming as before a new layer of solid reaction product thereon. This new layer of reaction product is removed by applying another pulse of laser radiation. In this manner, the copper is etched in layers until the entire metal is etched through thereby forming the desired pattern.

Following the completion of the copper etch, the substrate is thoroughly rinsed with dilute $NH_4OH$ to wash off the layer of solid reaction product formed in the areas of copper which were not irradiated with laser radiation. The $NH_4OH$ will make the unetched surfaces areas of copper look like freshly deposited copper pattern.

Using the present process copper etch rates in the range from several thousand Angstroms per minute to several microns per minute can be achieved the exact etch rate being a function of several parameters including the pressure in the reaction chamber, the wavelength, intensity and pulse width of the laser radiation and the pulse repetition rate of the laser source.

Another laser source which can be conveniently used for etching copper is a continuous wave argon laser operating at a wavelength of 515 nm and having an intensity in the range 0.3 KW/sq. cm. to 200 MW/sq. cm. The argon laser beam can be either a focussed or non-focussed beam for the purposes of the invention.

Another metal that can be etched using the invention is chromium. Etching of chromium is particularly important since MLC substrates utilize a sandwich layer of chromium-copper-chromium [wherein the thickness of the chromium layer is typically small, of the order of 800 Å and that of copper is about 5000 nm from which the desired interconnection pattern is formed. To etch a chromium layer formed on a substrate, chlorine can be used as the reactant gas as in the case of copper. The solid reactant product formed in this case is chromium chloride which can be selectively removed by irradiating with the same laser radiation used for etching copper. Thus, using the present process chromium-copper sandwich layers can be continuously etched in the same reaction chamber without changing the laser source. It will be appreciated that, under the same conditions, chromium etches about ten times slower than copper. If higher chromium etch rate is desired, the intensity of the laser source can be increased.

While the details of the present process have been discussed in the context of using a single component halogen gas, the invention is also suited for etching metals using a multicomponent halogen-based gas such as $CCl_4$, $XeF_2$, $Cl_2$, $Br_2$ and the gas mixture $CCl_4+O_2$. The halogen-based gas is introduced into the reaction chamber to react with the metal to form a metal halide reaction product. However, to enhance formation of the reaction product, it is sometimes necessary to selectively dissociate the halogen-based gas proximate the metal into reactant radicals. Once the necessary solid reaction product has been formed on the metal, it is selectively driven off by irradiating with laser radiation of a wavelength which is suitable for efficient absorption by the reaction product.

The above combination of gas dissocation and reaction product vaporization can be accomplished in three ways. In one approach, a multiwavelength pulsed laser having an ultraviolet component and a non-ultraviolet component is utilized. The UV component will dissociate the halogen based gas by photodissociation and the non-UV component will heat and excite and, ultimately, vaporize the reaction product thereby etching the metal. An example of a multiwavelength laser suitable for this purpose is pulsed Nd:YAG laser operating at its natural non-UV wavelength of 1060 nm and the UV wavelength of 335 nm which is obtained by frequency tripling the natural wavelength.

In the second approach, a UV lamp in conjunction with a laser operating at non-UV wavelengths is utilized. The UV lamp will dissociate the halogen based gas, by photodissociation, into reactant radicals and the non-UV laser will remove the reaction product. An example of the non-UV laser in this approach is Nd-YAG laser operating at a wavelength of 1060 nm.

In the third approach a single component laser which is capable of not only dissociating the halogen based gas, by thermal dissociation, into a halogen component which will react with the metal forming a reaction product, but also vaporization of the reaction product. One suitable single component laser source is continuous wave argon laser operating at a wavelength of 515 nm. Another suitable single component laser source for this purpose is the pulsed Nd:YAG laser operating at its second harmonic wavelength of 532 nm. A third single component laser source is the pulsed Nd:YAG laser operating at its third harmonic wavelength of 355 nm.

As in the case of etching a metal using a halogen gas, the metal etch rate obtained by using a halogen based gas is a function of the nature of the metal etched, the pressure within the reaction chamber, the degree of dissociation of the gas into reactant radicals, the intensity, wavelength, pulse width (in case of pulsed lasers) and repetition rate of the laser source utilized.

While the invention has been detailed in the context of projecting a laser beam in a pattern determined by a projection mask, patterns such as holes (or vias) in a metallized substrate can be formed in accordance with the invention by removing the projection optics components 102, 103 and 104 (FIG. 1) and placing a contact mask in close contact with the substrate. The contact mask can be a plate made of a metal such as molybdenum having a desired pattern of holes etched therethrough.

Figure 2:
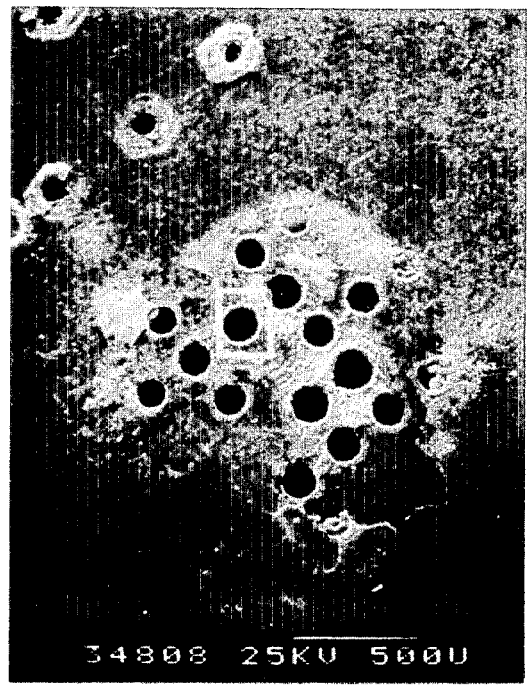
FIG. 2 is a scanning electron micrograph of a hole (or via) pattern etched in a copper layer using a molybdenum contact mask and a pulsed Nd:YAG laser in accordance with the invention.

FIG. 2 shows a scanning electron micrograph (SEM) of a via pattern formed in a copper coated ceramic substrate using a molybdenum pattern mask. The diameter of the vias is about 100 $\mu$m which is the same as that of the corresponding hole in the mask. The reactant gas used was $Cl_2$ and the laser was a Nd:YAG laser operating at a wavelength of 1060 nm, intensity 0.3 MW/sq. cm., pulse width 650 nsec, repetition rate of 10 Hz and having a beam diameter of 2 mm.

Figure 3:
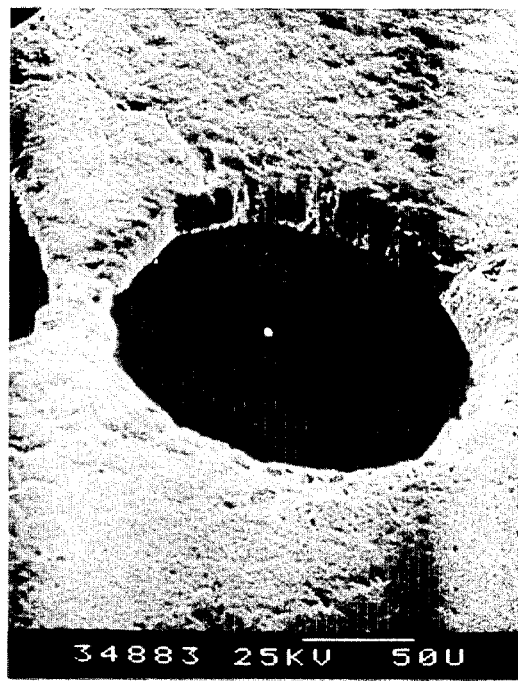
FIG. 3 is a close-up scanning electron micrograph of FIG. 2.

FIG. 3 is an enlarged view of a via structure for the via pattern shown in FIG. 2 showing the high quality of the etch profile obtained by the present process.

Figure 4:
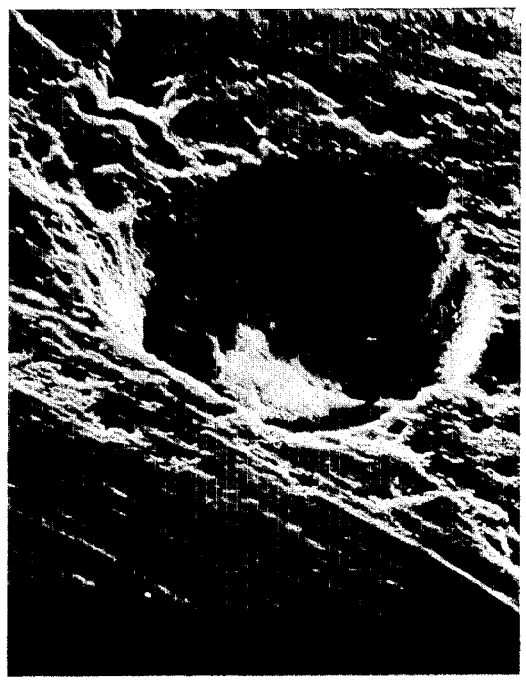
FIG. 4 is a scanning electron micrograph of a via formed in a copper layer using a focused argon laser in accordance with the invention.

FIG. 4 shows a scanning electron micrograph of a via formed in a copper layer deposited on a ceramic substrate in accordance with the invention using an argon laser operating at a wavelength of 515 nm and intensity 0.5 MW/sq. cm. The reactant gas in this case was also $Cl_2$.

The present invention has several advantages over prior art wet etching. The present process is simple. Since it is a dry etch process, caustic chemicals characteristic of wet etching are eliminated. Another advantage is the high etch rates ranging from several thousand angstroms per minute to several microns per minute that can be achieved coupled with excellent resolution of the etched pattern. Furthermore, the present process readily lends itself to scaling up, because the etching chemistry is very localized, that is, independent of apparatus dimension.

While the invention has been particularly described with respect to the preferred embodiment thereof, it will be understood by those skilled in the art that various changes in form and detail may be made therein without departing from the spirit and scope of the invention.

We claim:

1. A method of radiation induced dry etching of a metallized substrate comprising the steps of:
   (a) mounting the substrate in a reaction chamber,
   (b) establishing a predetermined low pressure in the chamber;
   (c) controllably introducing a selected gas into the chamber to form a solid reaction product with the metal by a partial consumption of said metal; and
   (d) selectively removing the reaction product by applying a beam of laser radiation and thereby selectively etching the metal.

2. The method as in claim 1 wherein said radiation is of a wavelength suitable for absorption by said reaction product or by said metal.

3. The method as in claim 2 wherein said reaction product is removed by said radiation by thermal and electronic excitation and eventual vaporization.

4. The method as in claim 2 wherein gas is a halogen gas.

5. The method as in claim 2 wherein said gas is a halogen based gas.

6. The method as in claim 4 wherein said gas is chlorine.

7. The method as in claim 6 wherein said metal is copper and said reaction product is copper chloride.

8. The method as in claim 6 wherein said metal is Chromium and said reaction product is chromium chloride.

9. The method as in claim 7 or 8 wherein said radiation is generated by a Nd:YAG laser.

10. The method as in claim 7 or 8 wherein said radiation is generated by an argon laser.

11. The method as in claim 9 wherein the wavelength of said Nd:YAG laser is selected from the group of component wavelengths consisting of 1060 nm, 532 nm and 355 nm.

12. The method as in claim 10 wherein said argon laser is a continuous wave laser operating at a wavelength of 515 nm.

13. The method as in claim 5 wherein radiation is of a wavelength suitable also for dissociating the halogen based gas into reactant radicals to enhance formation of said reaction product.

14. The method as in claim 13 wherein said laser is selected from the group consisting of a continuous wave argon laser operating at the wavelength of 515 nm and pulsed Nd:YAG lasers operating at the wavelengths of 532 nm and 355 nm, respectively.

15. The method as in claim 14 wherein said gas is thermally dissociated into reactant radicals and said reaction product is removed by thermal excitation by said laser radiation.

16. The method as in claim 5 wherein said radiation comprises ultraviolet component and non-ultraviolet component wavelengths, said ultraviolet component being suitable for dissociating said halogen based gas into reactant radicals to enhance formation of said reaction product and said non-ultraviolet component being suitable for excitation and removal of said reaction product.

17. The method as in claim 16 wherein said radiation is generated by a Nd:YAG laser, said ultraviolet component is of 355 nm wavelength and said non-ultraviolet component is of 1060 nm wavelength.

18. The method as in claim 5 wherein the wavelength of said laser radiation is in the non-ultraviolet region, said method further comprising applying ultraviolet radiation in simultaneous relationship with said laser beam to dissociate said halogen based gas into reactant radicals to enhance formation of said reaction product.

19. The method as in claim 18 wherein said ultraviolet radiation is generated by a UV flood lamp.

20. The method as in claim 18 wherein said laser is Nd:YAG laser operating at a wavelength of 1060 nm.

21. A method of radiation induced dry etching of a metal layer formed on a substrate, said method comprising:

reacting said metal layer with a halogen gas forming a solid metal halide reaction product layer thereon by a partial consumption of the metal layer; and selectively removing said reaction product by applying, in a predetermined pattern, laser radiation of a wavelength suitable for absorption by said reaction product and causing thermal and electronic excitation and eventual vaporization of the reaction product in a region in correspondence with said pattern and thereby selectively etching the metal layer.

22. The method as in claim 21 wherein said radiation is suitable for absorption by the metal underlying said reaction product.

23. The method as in claim 21 or 22 wherein said radiation is of a wavelength in the range 200–1060 nm.

* * * * *